(12) United States Patent
Wei et al.

(10) Patent No.: US 11,330,715 B2
(45) Date of Patent: May 10, 2022

(54) ELECTRONIC DEVICE

(71) Applicant: Wiwynn Corporation, New Taipei (TW)

(72) Inventors: Tzu-Yu Wei, New Taipei (TW); Yi-Tang Chen, New Taipei (TW); Yi-Shian Chen, New Taipei (TW); Chi-Hsiang Hung, New Taipei (TW); Kuan-Wei Chen, New Taipei (TW)

(73) Assignee: Wiwynn Corporation, New Taipei (TW)

(*) Notice: Subject to any disclaimer, the term of this patent is extended or adjusted under 35 U.S.C. 154(b) by 153 days.

(21) Appl. No.: 16/858,677

(22) Filed: Apr. 26, 2020

(65) Prior Publication Data

US 2021/0267059 A1    Aug. 26, 2021

(30) Foreign Application Priority Data

Feb. 21, 2020    (TW) .................................. 109105625

(51) Int. Cl.
    *H05K 1/14*    (2006.01)
    *H05K 5/02*    (2006.01)
    *G06F 1/16*    (2006.01)

(52) U.S. Cl.
    CPC ........... *H05K 1/141* (2013.01); *G06F 1/1658* (2013.01); *H05K 5/0286* (2013.01)

(58) Field of Classification Search
    USPC ........................................................ 361/737
    See application file for complete search history.

(56) References Cited

U.S. PATENT DOCUMENTS

| 7,440,293 B2* | 10/2008 | Hood, III | ................ G06F 1/184 361/807 |
| 8,287,290 B2* | 10/2012 | Cohen | .................... H01R 12/73 439/66 |

(Continued)

FOREIGN PATENT DOCUMENTS

| CN | 105701050 | 6/2019 |
| TW | I385502 | 2/2013 |

OTHER PUBLICATIONS

"Office Action of Taiwan Counterpart Application", dated Sep. 9, 2020, p. 1-p. 6.

*Primary Examiner* — Hung S. Bui
(74) *Attorney, Agent, or Firm* — JCIPRNET

(57) ABSTRACT

An electronic device includes a motherboard, a bridging device, and an add-in card. The motherboard includes a processor, a first circuit board, and a first connector. The processor is coupled to the first connector through the first circuit board. The bridging device includes a second circuit board and a second connector and is disposed on the motherboard and coupled to the first connector. The second connector is coupled to the first connector through the second circuit board. The add-in card includes a third circuit board and a peripheral circuit and is disposed on the bridging device and coupled to the second connector. The peripheral circuit is coupled to the second connector through the third circuit board. The processor is coupled to the peripheral circuit through a signal path including the first circuit board, the first connector, the second circuit board, the second connector, and the third circuit board.

8 Claims, 2 Drawing Sheets

(56) References Cited

U.S. PATENT DOCUMENTS

| | | | | |
|---|---|---|---|---|
| 8,898,362 B2* | 11/2014 | Sun | ................... | G06F 13/4063 |
| | | | | 710/300 |
| 8,979,551 B2* | 3/2015 | Mongold | ............... | H01R 12/73 |
| | | | | 439/74 |
| 9,710,421 B2 | 7/2017 | Tamarkin et al. | | |
| 9,716,361 B2* | 7/2017 | Huang | ................. | H01R 25/00 |
| 10,176,143 B2 | 1/2019 | Tamarkin et al. | | |
| 2005/0270298 A1* | 12/2005 | Thieret | ................ | G06F 13/409 |
| | | | | 345/502 |
| 2016/0170928 A1 | 6/2016 | Tamarkin et al. | | |
| 2017/0286353 A1 | 10/2017 | Tamarkin et al. | | |
| 2019/0045634 A1* | 2/2019 | Hill | ....................... | G06F 13/40 |

\* cited by examiner

ELECTRONIC DEVICE

CROSS-REFERENCE TO RELATED APPLICATION

This application claims the priority benefit of Taiwan application serial no. 109105625, filed on Feb. 21, 2020. The entirety of the above-mentioned patent application is hereby incorporated by reference herein and made a part of this specification.

BACKGROUND

Technical Field

The disclosure relates to a device, and in particular, to an electronic device.

Description of Related Art

With the development of technologies, such as artificial intelligence, machine learning, and in-depth learning, existing electronic devices more widely adopt a distributed computing architecture to support the above technologies. In a computing electronic device having said architecture, specific computations are performed through a processor and a specific peripheral circuit, e.g., a graphics processing unit (GPU), so as to accelerate the overall computing efficiency of the electronic device. In a conventional electronic device, a motherboard provided with the processor may be connected to an add-in card provided with the peripheral circuit. However, in order to improve the signal quality of the processor and the peripheral circuit in the conventional electronic device, materials of the overall motherboard need to be replaced with materials at higher costs, whereby the quality of signals transmitted on the motherboard may be further improved, and signal losses may be reduced, thus leading to an increase in the manufacturing costs of the electronic device.

SUMMARY

The disclosure provides an electronic device which can be made at reduced manufacturing costs through a bridging device, and the quality of signals transmitted between a processor and a peripheral device may be improved.

An electronic device provided in an embodiment of the disclosure includes a motherboard, a bridging device, and an add-in card. The motherboard includes a processor, a first circuit board, and a first connector. The processor is coupled to the first connector through the first circuit board. The bridging device includes a second circuit board and a second connector, is disposed on the motherboard, and is coupled to the first connector of the motherboard. The second connector is coupled to the first connector through the second circuit board. The add-in card includes a third circuit board and a peripheral circuit, is disposed on the bridging device, and is coupled to the second connector of the bridging device. The peripheral circuit is coupled to the second connector through the third circuit board. The processor is coupled to the peripheral circuit through a signal path. The signal path includes the first circuit board, the first connector, the second circuit board, the second connector, and the third circuit board.

An electronic device provided in an embodiment of the disclosure includes a motherboard, a bridging device, a riser card, and an add-in card. The motherboard includes a processor, a first circuit board, and a first connector. The processor is coupled to the first connector through the first circuit board. The bridging device includes a second circuit board and a second connector, is disposed on the motherboard, and is coupled to the first connector of the motherboard. The second connector is coupled to the first connector through the second circuit board. The riser card includes a third circuit board and a third connector, is disposed on the bridging device, and is coupled to the second connector of the bridging device. The third connector is coupled to the second connector through the third circuit board. The add-in card includes a fourth circuit board and a peripheral circuit, is disposed on a side edge of the riser card, and is coupled to the third connector of the riser card. The peripheral circuit is coupled to the third connector through the fourth circuit board. The processor is coupled to the peripheral circuit through a signal path. The signal path includes the first circuit board, the first connector, the second circuit board, the second connector, the third circuit board, the third connector, and the fourth circuit board.

Based on the above, the bridging device of the electronic device may effectively reduce losses of signals in the signal path passing through the motherboard, and the bridging device with a smaller area may be applied to transmit signals, so as to effectively reduce manufacturing costs of the electronic device without modifying the materials of the overall motherboard and to increase the signal quality and the signal integrity of the overall electronic device.

DESCRIPTION OF THE EMBODIMENTS

Figure 1:
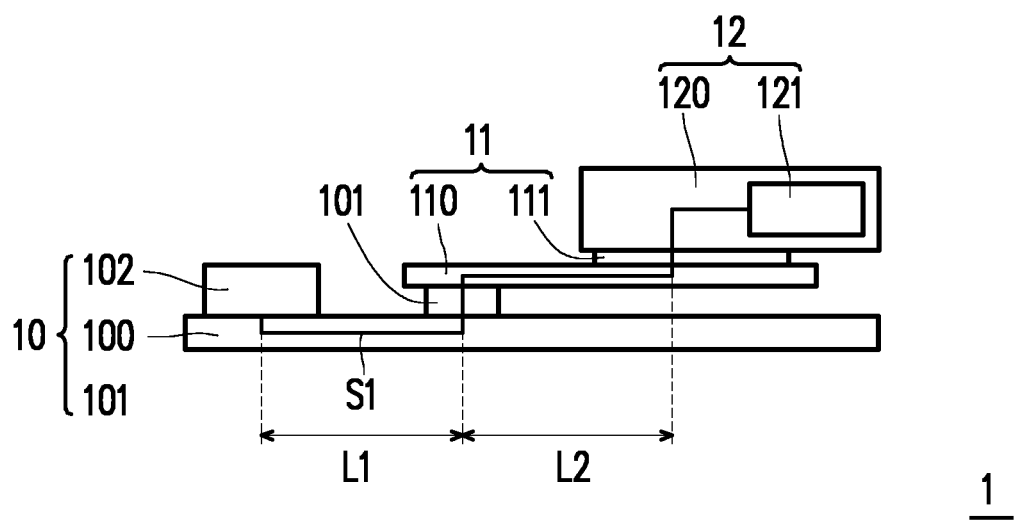
FIG. 1 is a schematic view of an electronic device according to an embodiment of the disclosure.

FIG. 1 is a schematic view of an electronic device 1 according to an embodiment of the disclosure. The electronic device 1 includes a motherboard 10, a bridging device 11, and an add-in card 12. The motherboard 10 includes a circuit board 100, a connector 101, and a processor 102. The bridging device 11 includes a circuit board 110 and a connector 111. The add-in card 12 includes a circuit board 120 and a peripheral circuit 121. The processor 102 on the motherboard 10 may be connected to the peripheral circuit 121 through the bridging device 11, to shorten the length of a signal transmission path of the processor 102 on the circuit board 100, and increase the signal quality and the signal integrity of the electronic device 1. In addition, the modular bridging device 11 is used to reduce the complexity for designing signal traces, and the existing connector 101 of the motherboard 10 is used to reduce design costs, to reduce overall manufacturing costs of the electronic device 1.

Specifically, the processor 102 of the motherboard 10 is electrically coupled to the connector 101 through the circuit board 100. In an embodiment, the processor 102 may be a central processing unit (CPU), another programmable general-purpose or special-purpose micro control unit (MCU), a microprocessor, a digital signal processor (DSP), a programmable controller, an application specific integrated circuit (ASIC), a graphics processing unit (GPU), an arithmetic logic unit (ALU), a complex programmable logic device (CPLD), a field programmable gate array (FPGA), or another similar element, or a combination of the foregoing elements. The circuit board 100 is a rigid printed circuit board (PCB) with a multilayer structure. The connector 101 may be a board to board and mezzanine connector. The connector 101 may be a direct-attach connector. Alternatively, the connector 101 may be a direct soldering connector. It falls within the scope of the disclosure provided that the circuit board 100 and the circuit board 110 may be connected in parallel.

The bridging device 11 is disposed on the motherboard 10, and the circuit board 110 of the bridging device 11 is directly coupled to the connector 101 of the motherboard 10. The connector 111 of the bridging device 11 is electrically coupled to the connector 101 of the motherboard 10 through the circuit board 110. In an embodiment, the circuit board 110 is a rigid PCB with a multilayer structure. The connector 111 may be a surface-mount technology (SMT) connector. The connector 111 may be a press-fit connector. The connector may be a plating through hole (PTH) connector. It falls within the scope of the disclosure provided that the circuit board 110 and the circuit board 120 may be connected in a parallel to vertical manner.

The add-in card 12 is disposed on the connector 111 of the bridging device 11, and the circuit board 120 of the add-in card 12 is directly coupled to the connector 111 of the bridging device 11. The peripheral circuit 121 is electrically coupled to the connector 111 of the bridging device 11 through the circuit board 120. In an embodiment, the add-in card 12 is an external display card. In an embodiment, the peripheral circuit 121 is a GPU.

In an embodiment, the circuit board 110 is disposed on and in parallel to the circuit board 100. The circuit board 120 is vertically disposed on the circuit board 110. The processor 102 may be coupled to the peripheral circuit 121 through a signal path S1. The signal path S1 includes the circuit board 100, the connector 101, the circuit board 110, the connector 111, and the circuit board 120. The processor 102 may exchange signals with and/or provide signals to the add-in card 12 through the signal path S1. In an embodiment, the electronic device 1 may meet requirement specifications of the Peripheral Component Interconnect-Express (PCI-e) Generation 5 (Gen5), and a set bandwidth of the signal path S1 may meet a set bandwidth (for example, 16 GHz) of the PCI-e Gen5. In an embodiment, in the set bandwidth of the PCI-e Gen5, an insertion loss generated by per unit length of signal traces of the circuit board 110 of the bridging device 11 is less than an insertion loss generated by per unit length of signal traces of the circuit board 100 of the motherboard 10. In an embodiment, in the set bandwidth (for example, 16 GHz) of the PCI-e Gen5, on a signal line of the circuit board 110 of the bridging device 11, the insertion loss per unit length is 0.75 dB, and on a signal line of the circuit board 100 of the motherboard 10, the insertion loss per unit length is 1.1 dB.

In addition, as shown in FIG. 1, the length of a signal transmission path of the signal path S1 in the circuit board 100 is L1, and the length of a signal transmission path of the signal path S1 in the circuit board 110 is L2. In other words, the electronic device 1 reduces the length of the path for transmitting signals in the signal path S1 through the circuit board 100. Therefore, the electronic device 1 may use the bridging device 11 to reduce the length of the path for transmitting signals in the signal path S1 through the circuit board 100. Therefore, the electronic device 1 can effectively reduce manufacturing costs of the electronic device 1 without changing materials of the circuit board 100 or without using expensive materials, and increase the signal quality and the signal integrity of the overall electronic device 1.

Figure 2:
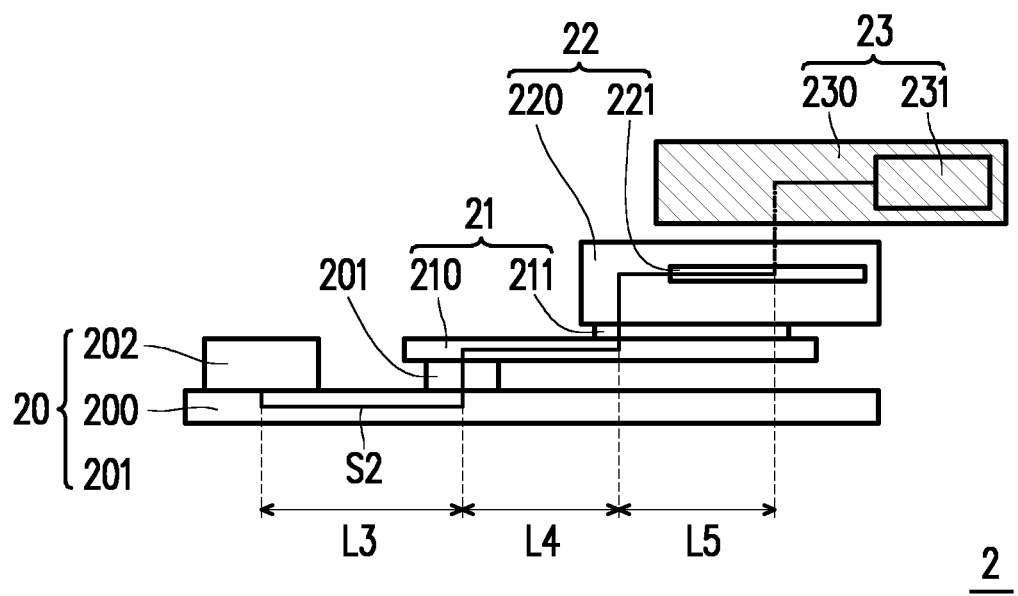
FIG. 2 is a schematic view of an electronic device according to an embodiment of the disclosure.
Figure 3:
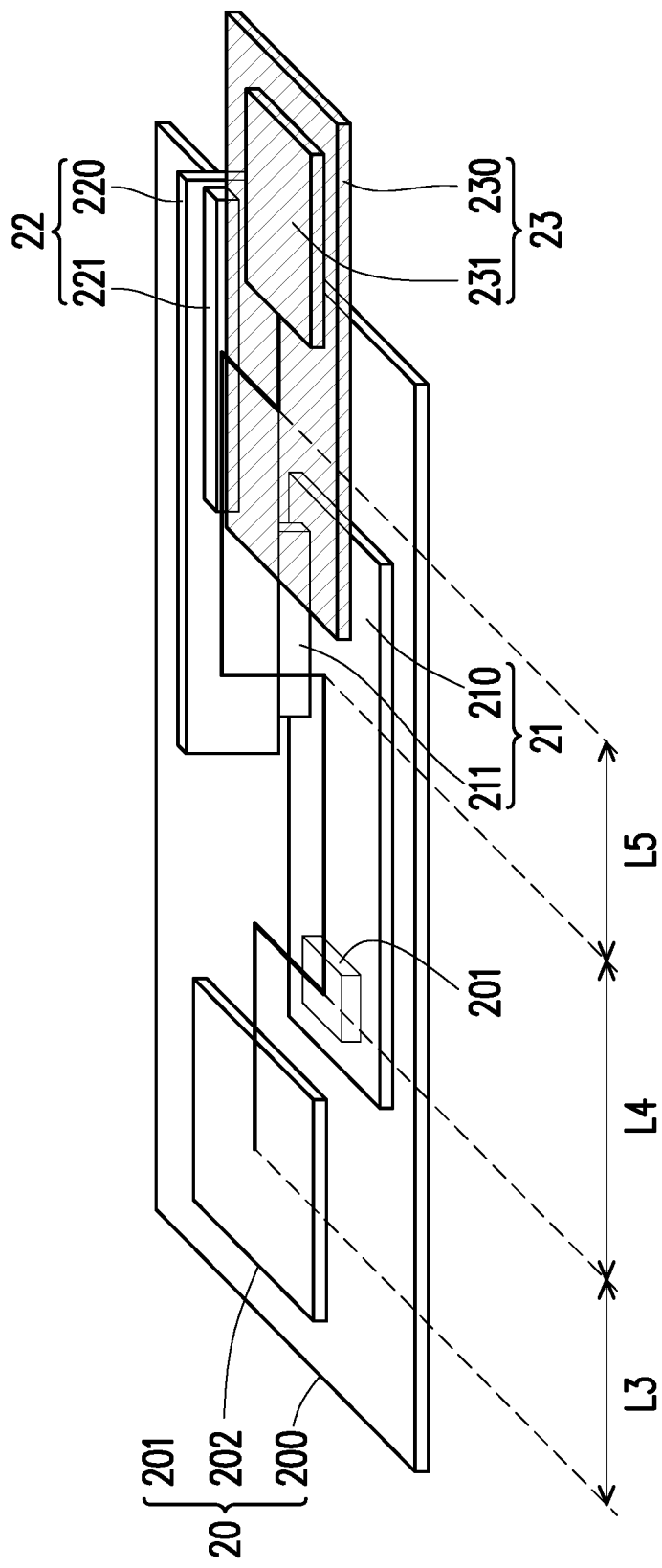
FIG. 3 is a three-dimensional perspective view of the electronic device shown in FIG. 2.

FIG. 2 is a schematic view of an electronic device 2 according to an embodiment of the disclosure, and FIG. 3 is a three-dimensional perspective view of the electronic device 2 shown in FIG. 2. The electronic device 2 shown in FIG. 2 is used for describing connection relationships between elements in the electronic device 2. The detailed coupling relationships in the electronic device 2 may be referred to as what is illustrated in FIG. 3 together, so as to better understand the overall configuration of the electronic device 2. The electronic device 2 includes a motherboard 20, a bridging device 21, a riser card 22, and an add-in card 23. The motherboard 20 includes a circuit board 200, a connector 201, and a processor 202. The bridging device 21 includes a circuit board 210 and a connector 211. The riser card 22 includes a circuit board 220 and a connector 221. The add-in card 23 includes a circuit board 230 and a peripheral circuit 231. The processor 202 on the motherboard 20 may be connected to the peripheral circuit 231 of the add-in card 23 through the bridging device 21 and the riser card 22, to shorten the length of a signal transmission path of the processor 202 on the circuit board 200, and increase the signal quality and the signal integrity of the electronic device 2. In addition, the modular bridging device 21 is used to reduce the complexity for designing signal traces in the motherboard 10, and the existing connector 201 of the motherboard 20 is used to reduce design costs, to reduce overall manufacturing costs of the electronic device 2.

Specifically, the processor 202 of the motherboard 20 is electrically coupled to the connector 201 through the circuit board 200. In an embodiment, the processor 102 may be a CPU, another programmable general-purpose or special-purpose MCU, a microprocessor, a DSP, a programmable controller, an ASIC, a GPU, an ALU, a CPLD, an FPGA, or another similar element, or a combination of the foregoing elements. The circuit board 200 is a rigid PCB with a multilayer structure. The connector 201 may be a board to board and mezzanine connector. The connector 201 may be a direct-attach connector. Alternatively, the connector 201 may be a direct soldering connector. It falls within the scope of the disclosure provided that the circuit board 200 and the circuit board 210 may be connected in parallel.

The bridging device 21 is disposed on the motherboard 20. The circuit board 210 of the bridging device 21 is directly coupled to the connector 201 of the motherboard 20. The connector 211 of the bridging device 21 is electrically coupled to the connector 201 of the motherboard 20 through the circuit board 210. In an embodiment, the circuit board 210 is a rigid PCB with a multilayer structure. The connector 211 may be a board to board connector. The connector 211 may be a small pitch connector.

The riser card 22 is disposed on the connector 211 of the bridging device 21. The circuit board 220 of the riser card 22 is directly is coupled to the connector 211 of the bridging device 21. The connector 221 is disposed on a side edge of the circuit board 220. The connector 221 of the riser card 22 is electrically coupled to the connector 211 of the bridging device 21 through the circuit board 220. In an embodiment, the circuit board 220 is a rigid PCB. In an embodiment, the connector 221 may be a PCI-e slot connector. The connector 221 may be an SMT connector.

The add-in card 23 is disposed on a side face of the riser card 22. The add-in card 23 is disposed on the connector 221 on the side face of the riser card 22. The circuit board 230 of the add-in card 23 is directly coupled to the connector 221 of the riser card 22. The peripheral circuit 231 is electrically coupled to the connector 221 of the riser card 22 through the circuit board 230. In an embodiment, the add-in card 23 is an external display card. In an embodiment, the circuit board 230 is a rigid PCB. In an embodiment, the peripheral circuit 231 is a GPU.

In an embodiment, the circuit board 210 is disposed on and in parallel to the circuit board 200. In an embodiment, the circuit board 220 is vertically disposed on the circuit board 210. In an embodiment, the circuit board 230 is vertically disposed on a side face of the circuit board 220. In an embodiment, the processor 202 may be coupled to the peripheral circuit 231 through a signal path S2. The signal path S2 includes the circuit board 200, the connector 201, the circuit board 210, the connector 211, the circuit board 220, the connector 221, and the circuit board 230. Overall, the processor 202, the circuit board 200, the connector 201, the circuit board 210, the connector 211, the circuit board 220, the connector 221, the circuit board 230, and the peripheral circuit 231 may form the signal path S2. The processor 202 may provide signals to and/or receive signals from the peripheral circuit 231 through the signal path S2. In an embodiment, the electronic device 2 may meet signals of the PCI-e Gen5, and a set bandwidth of the signal path S2 may meet a set bandwidth of the PCI-e Gen5. In an embodiment, in the set bandwidth of the PCI-e Gen5, an insertion loss generated by per unit length of signal traces of the circuit board 210 of the bridging device 21 is less than an insertion loss generated by per unit length of signal traces of the circuit board 200 of the motherboard 20.

In addition, as shown in FIG. 2 and FIG. 3, the length of a signal transmission path of the signal path S2 in the circuit board 200 is L3, and the length of a signal transmission path of the signal path S2 in the circuit board 210 is L4. In other words, the electronic device 2 may reduce the length of the path for transmitting signals in the signal path S2 through the circuit board 200. Therefore, the electronic device 2 may use the bridging device 21 to reduce the length of the path for transmitting signals in the signal path S2 through the circuit board 200. Therefore, the electronic device 2 can effectively reduce manufacturing costs of the electronic device 2 without changing materials of the circuit board 200 or without using expensive materials, and increase the signal quality and the signal integrity of the overall electronic device 2.

In an embodiment, the length L3 of the signal transmission path of the signal path S2 in the circuit board 200 is 3.5 inches, the length L4 of the signal transmission path in the circuit board 210 is 5.5 inches, and the length L5 of the signal transmission path in the circuit board 220 is 1 inch. In the present embodiment, when the signal path S2 is operating in the set bandwidth of the PCI-e Gen5, the insertion loss of the circuit board 200 is 3.85 dB, the insertion loss of the circuit board 210 is 4.125 dB, the insertion loss of the circuit board 220 is 0.75 dB, the insertion loss of the circuit board 230 is 5.5 dB, and the insertion loss of the electronic device 2 for transmitting signals from the processor 202 to the peripheral circuit 231 through the signal path S2 is 34.125 dB.

Based on the above, the electronic device can use the bridging device to reduce the length of the signal transmission path in the electronic device through the motherboard. Therefore, the electronic device can effectively reduce manufacturing costs of the electronic device without changing materials of the circuit board or without using expensive materials, and increase the signal quality and the signal integrity of the overall electronic device.

What is claimed is:

1. An electronic device, comprising:
    a motherboard, comprising a processor, a first circuit board, and a first connector, wherein the processor is coupled to the first connector through the first circuit board;
    a bridging device, comprising a second circuit board and a second connector, disposed on the motherboard, and coupled to the first connector of the motherboard, wherein the second connector is coupled to the first connector through the second circuit board; and
    an add-in card, comprising a third circuit board and a peripheral circuit, disposed on the bridging device, and coupled to the second connector of the bridging device, wherein the peripheral circuit is coupled to the second connector through the third circuit board,
    wherein the processor is coupled to the peripheral circuit through a signal path, and the signal path comprises the first circuit board, the first connector, the second circuit board, the second connector, and the third circuit board,
    wherein in a set bandwidth, an insertion loss per unit length of the second circuit board is less than an insertion loss per unit length of the first circuit board.

2. The electronic device according to claim 1, wherein the first connector is a board to board and mezzanine connector.

3. The electronic device according to claim 1, wherein the first circuit board is a rigid printed circuit board, the second circuit board is a rigid printed circuit board, the second circuit board is disposed on and in parallel to the first circuit board, and the third circuit board is vertically disposed on the second circuit board.

4. The electronic device according to claim 1, wherein the set bandwidth is a set bandwidth complying with Peripheral Component Interconnect-Express Generation 5.

5. An electronic device, comprising
    a motherboard, comprising a processor, a first circuit board, and a first connector, wherein the processor is coupled to the first connector through the first circuit board;
    a bridging device, comprising a second circuit board and a second connector, disposed on the motherboard, and coupled to the first connector of the motherboard, wherein the second connector is coupled to the first connector through the second circuit board;
    a riser card, comprising a third circuit board and a third connector, disposed on the bridging device, and coupled to the second connector of the bridging device, wherein the third connector is coupled to the second connector through the third circuit board; and
    an add-in card, comprising a fourth circuit board and a peripheral circuit, disposed on a side edge of the riser card, and coupled to the third connector of the riser card, wherein the peripheral circuit is coupled to the third connector through the fourth circuit board,
    wherein the processor is coupled to the peripheral circuit through a signal path, and the signal path comprises the first circuit board, the first connector, the second circuit board, the second connector, the third circuit board, the third connector, and the fourth circuit board,
    wherein in a set bandwidth, an insertion loss per unit length of the second circuit board is less than an insertion loss per unit length of the first circuit board.

6. The electronic device according to claim 5, wherein the first connector is a board to board and mezzanine connector, the second connector is a small pitch connector, and the third connector is a Peripheral Component Interconnect-Express slot connector.

7. The electronic device according to claim 5, wherein the first circuit board is a rigid printed circuit board, the second circuit board is a rigid printed circuit board, the third circuit board is a rigid printed circuit board, the second circuit board is disposed on and in parallel to the first circuit board, the third circuit board is disposed on and in parallel to the second circuit board, and the fourth circuit board is vertically disposed on the third circuit board.

8. The electronic device according to claim 5, wherein the set bandwidth is a set bandwidth complying with a Peripheral Component Interconnect-Express Generation 5 standard.

\* \* \* \* \*